US008227887B2

(12) United States Patent
Brown et al.

(10) Patent No.: US 8,227,887 B2
(45) Date of Patent: Jul. 24, 2012

(54) PHOTODETECTOR AND DISPLAY DEVICE PROVIDED WITH THE SAME

(75) Inventors: Christopher Brown, Oxford (GB); Hiromi Katoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 458 days.

(21) Appl. No.: 12/601,990

(22) PCT Filed: Jun. 12, 2008

(86) PCT No.: PCT/JP2008/060772
§ 371 (c)(1), (2), (4) Date: Nov. 25, 2009

(87) PCT Pub. No.: WO2008/156023
PCT Pub. Date: Dec. 24, 2008

(65) Prior Publication Data

US 2010/0193804 A1 Aug. 5, 2010

(30) Foreign Application Priority Data

Jun. 21, 2007 (JP) ................................ 2007-164283

(51) Int. Cl.
*H01L 33/00* (2010.01)

(52) U.S. Cl. .......... 257/458; 257/E31.061; 257/E33.076

(58) Field of Classification Search .................. 257/458, 257/E31.061, E33.076
See application file for complete search history.

(56) References Cited

U.S. PATENT DOCUMENTS 6,236,063 B1 5/2001 Yamazaki et al.
6,455,836 B1 * 9/2002 Hula ........................ 250/214 R
6,489,631 B2 12/2002 Young et al.
7,205,641 B2 4/2007 Shiu et al.
7,829,920 B2 11/2010 Cho et al.
7,952,159 B2 5/2011 Weng et al.

(Continued)

FOREIGN PATENT DOCUMENTS

JP 2003-273361 9/2003

(Continued)

OTHER PUBLICATIONS

Notice of Allowance issue in U.S. Appl. No. 12/602,395 dated Nov. 25, 2011.

(Continued)

*Primary Examiner* — Zandra Smith
*Assistant Examiner* — Paul Patton
(74) *Attorney, Agent, or Firm* — Nixon & Vanderhye, P.C.

(57) ABSTRACT

Provided are a photodetector capable of suppressing variations in the output characteristics among photodiodes, and a display device provided with the photodetector. A display device in use has an active matrix substrate (20) including a transparency base substrate (2), a plurality of active elements and a photodetector. The photodetector includes a light-shielding layer (3) provided on one main surface of the base substrate (2), a photodiode (1) arranged on an upper layer of the light-shielding layer (3), and an electrode (12) arranged in the vicinity of the photodiode (1) on the upper layer of the light-shielding layer (3). The photodiode (1) includes a silicon layer (11), and the silicon layer (11) is insulated electrically from the light-shielding layer (3). The electrode (12) is insulated electrically from the light-shielding layer (3) and the silicon layer (11). The light-shielding layer (3) is formed so that a part thereof is overlapped with the entire silicon layer (11) and the other part is overlapped with the electrode (12) in the thickness direction of the base substrate (2).

5 Claims, 12 Drawing Sheets

U.S. PATENT DOCUMENTS

| | | | |
|---|---|---|---|
| 7,955,890 | B2 | 6/2011 | Choi et al. |
| 2005/0045881 | A1 | 3/2005 | Nakamura |
| 2007/0069632 | A1 | 3/2007 | Peng |
| 2007/0093007 | A1 | 4/2007 | Deane |
| 2009/0008665 | A1 | 1/2009 | Lee et al. |
| 2009/0050891 | A1 | 2/2009 | Katoh |

FOREIGN PATENT DOCUMENTS

| | | |
|---|---|---|
| JP | 2004-54281 | 2/2004 |
| JP | 2007-114315 | 5/2007 |

OTHER PUBLICATIONS

U.S. Appl. No. 12/602,395, filed Nov. 30, 2009, entitled "Photodetector and Display Device Provided with the Same".
U.S. Office Action mailed Jun. 22, 2011 in U.S. Appl. No. 12/602,395.
International Search Report for PCT/JP2008/060772, mailed Sep. 2, 2008.

* cited by examiner

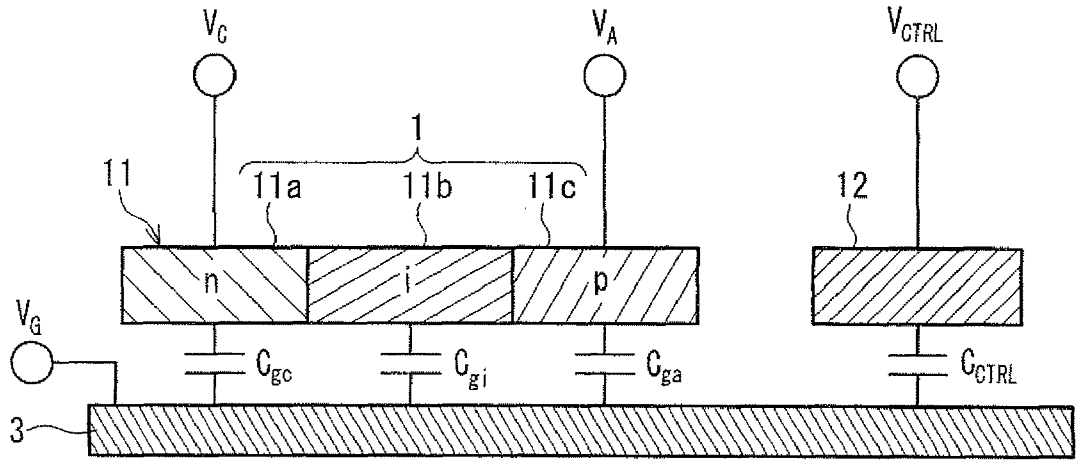

$$C_{diode} = C_{gc}+C_{gi}+C_{ga}$$

$$V_{go} = V_{CTRL}\left(\frac{C_{CTRL}}{C_{CTRL}+C_{diode}}\right)$$

$$V_G \fallingdotseq V_{go}+V_A\left(\frac{C_{ga}}{C_{CTRL}+C_{diode}}\right)$$

$$\fallingdotseq V_{CTRL}\left(\frac{C_{CTRL}}{C_{CTRL}+C_{diode}}\right)+V_A\left(\frac{C_{ga}}{C_{CTRL}+C_{diode}}\right)$$

FIG. 11

$$V_G \doteqdot V_{go} + V_A \left( \frac{C_{ga}}{C_{CTRL} + C_{diode}} \right)$$

$$\doteqdot V_{CTRL} \left( \frac{C_{CTRL}}{C_{CTRL} + C_{diode}} \right) + V_A \left( \frac{C_{ga}}{C_{CTRL} + C_{diode}} \right)$$

PHOTODETECTOR AND DISPLAY DEVICE PROVIDED WITH THE SAME

This application is the U.S. national phase of International Application No. PCT/JP2008/060772, filed 12 Jun. 2008, which designated the U.S. and claims priority to Japan Application No. 2007-164283, filed 21 Jun. 2007, the entire contents of each of which are hereby incorporated by reference.

TECHNICAL FIELD

The present invention relates to a photodetector and a display device provided with the same.

Recently, a display device represented by a liquid crystal display device often is equipped with a photo sensor for automatically adjusting brightness of a display screen in accordance with the intensity of light surrounding the display device. A display device having a plurality of photo sensors arranged in a matrix also has been known. In this display device, the plural photo sensors function as one area sensor, thereby capturing an image at the observer side.

The incorporation of the photo sensor in the display device can be achieved by mounting a photo sensor as a discrete component on a display panel thereof. Alternatively, a photo sensor can be formed monolithically on an active matrix substrate by utilizing a process for forming an active element (TFT) or a peripheral circuit.

In the field of a display device for a mobile terminal device in particular, the photo sensor is required to be formed monolithically on the active matrix substrate, from the viewpoint of reducing the number of components and downsizing the display device. As the photo sensor formed monolithically, a photodiode formed of a silicon layer, for instance, is known (see, for instance, JP 2006-3857 A: FIGS. 2 and 3).

Hereinafter, a conventional photodiode (photo sensor) will be explained with reference to FIG. 12. FIG. 12 is a cross-sectional view showing a configuration of a liquid crystal display panel having a photodiode. As shown in FIG. 12, a photodiode 51 is a PIN diode having a lateral structure, which is formed monolithically on an active matrix substrate 50 that forms a liquid crystal display panel.

As shown in FIG. 12, the photodiode 51 includes a silicon layer 60. The silicon layer 60 is formed on a glass substrate 52 as the base substrate of the active matrix substrate 50, by utilizing a process of forming a thin film transistor (TFT) that functions as an active element, at the same time of forming the TFT. Further on the silicon layer 60, an n-type semiconductor region (n-layer) 51*a*, an intrinsic semiconductor region (i-layer) 51*b* and a p-type semiconductor region (p-layer) 51*c* are formed in this order along the planar direction. The i-layer 51*b* serves as a photodetection region of the photodiode 51.

On an under layer of the photodiode 51, a light-shielding layer 53 for shielding light from a backlight device (not shown) is provided. The light-shielding layer 53 is covered with an insulating base coat 54. Typically the light-shielding layer 53 is formed of a metal material. The light-shielding layer 53 is in an electrically suspended state, insulated from the ambience. The photodiode 51 is covered further with interlayer insulating layers 55 and 56.

In FIG. 12, numeral 57 denotes a wiring connected to the n-layer 51*a*, and 58 denotes a wiring connected to the p-layer 51*c*. Numeral 59 denotes a flattening layer, and 61 denotes a protective layer. Numeral 62 denotes a liquid crystal layer. For a filter substrate 63, only the appearance is shown.

DISCLOSURE OF THE INVENTION

Problem to be Solved by the Invention

In the example as shown in FIG. 12, since the metal light-shielding layer 53 is arranged on the under layer of the photodiode 51, the output characteristics of the photodiode 51 fluctuate with the fluctuation in an electric potential of the light-shielding layer 53. And the electric potential of the light-shielding layer 53 fluctuates in connection with the fluctuation in an electric potential of the photodiode p-layer 51*c*.

However, the light-shielding layer 53, the photodiode 51 and the other films positioned in the vicinity of the photodiode 51 contain a fixed charge captured during the formation process. The amount of the fixed charge varies among the photodiodes or the active matrix substrates, and the difference in the fixed charge results in the difference in the relationship between the electric potential of the light-shielding layer 53 and the output characteristics of the photocliode. Namely, in a case where a plurality of photodiodes 51 of the same specification are provided, the output characteristics may vary among the photodiodes even though an equal voltage is applied to the respective p-layers 51*c* and the electric potentials in the respective light-shielding layers are set to be equivalent.

The relationship between the electric potential of the light-shielding layer 53 and the output characteristics of the photodiode will vary due to not only the fixed charge but the variations in the diffusion concentration of impurities in the semiconductor regions of the photodiode 51. Similarly to the above-described case, the output characteristics may be varied among the photodiodes even though an equivalent voltage is applied to the respective p-layers 51*c*.

As mentioned above, in the example as shown in FIG. 12, a problem that the output characteristics vary among the photodiodes arises. Specifically for instance, the output characteristics are different from one product to another even for the photodiodes of the same specification. Alternatively, the output characteristics are different from one photodiode to another even for photodiodes of the same specification mounted on the same active matrix substrate. In such a case, it will be difficult to adjust the brightness of the display screen with the photo sensor or to capture a high-resolution picture.

An object of the present invention is to provide a photodetector capable of solve the above-mentioned problems and suppressing variations in the output characteristics among the photodiodes, and a display device provided with the photodetector.

Means for Solving Problem

For achieving the above-described object, a photodetector according to the present invention is characterized in that it includes a transparency base substrate, a metal layer provided on one main surface of the base substrate, a photodiode arranged on an upper layer of the metal layer, and an electrode arranged in the vicinity of the photodiode on the upper layer of the metal layer, wherein the photodiode comprises a silicon layer having a semiconductor region, the silicon layer is insulated electrically from the metal layer; the electrode is insulated electrically from the metal layer and the silicon layer; and the metal layer is formed so that a part of the metal layer is overlapped with the silicon layer and the other part of the metal layer is overlapped with the electrode in the thickness direction of the base substrate.

And, for achieving the above-described object, a display device according to the present invention is characterized in that it has an active matrix substrate, wherein the active matrix substrate comprises a transparency base substrate, a plurality of active elements formed on one main surface of the base substrate, and a photodetector, where the photodetector comprises a metal layer provided on one main surface of the base substrate, a photodiode arranged on an upper layer of the metal layer, and an electrode arranged in the vicinity of the photodiode on the upper layer of the metal layer; the photodiode comprises a silicon layer having a semiconductor region, the silicon layer is insulated electrically from the metal layer; the electrode is insulated electrically from the metal layer and the silicon layer; and the metal layer is formed so that a part of the metal layer is overlapped with the silicon layer and the other part of the metal layer is overlapped with the electrode in the thickness direction of the base substrate.

Effects of the Invention

As mentioned above, according to the present invention, the metal layer to form a light-shielding layer for the photodiode spreads to the under layer of the electrode arranged in the vicinity of the photodiode, and thus the electric potential of the light-shielding layer (metal layer) can be adjusted by applying the electrode with voltage. Further, the relationship between the electric potential of the light-shielding layer and the output characteristics of the photodiode can be controlled by adjusting the electric potential of the light-shielding layer, thereby a problem that the output characteristics vary among the photodiodes even if the voltages applied to the photodiodes are equivalent can be avoided. Therefore, according to the present invention, variations in the output characteristics among the photodiodes can be suppressed.

BRIEF DESCRIPTION OF DRAWINGS

FIG. 4 includes diagrams showing an electric potential of a light-shielding layer and a state of a photodiode.

FIG. 5 includes diagrams showing an electric potential of a light-shielding layer and a state of a photodiode. FIG. 5 is distinguished from FIG. 4 in the electric potential level of the light-shielding layer.

FIG. 6 includes diagrams showing an electric potential of a light-shielding layer and a state of a photodiode. FIG. 6 is distinguished from FIGS. 4 and 5 in the electric potential level of the light-shielding layer.

FIG. 9 shows an example distinguished from FIG. 8 in the relationship between the electric potential of the light-shielding layer and the output characteristics of the photodiode.

FIG. 10 shows an example distinguished from FIGS. 8 and 9 in the relationship between the electric potential of the light-shielding layer and the output characteristics of the photodiode.

FIG. 11 is an explanatory view showing a relationship between the light-shielding layer, the photodiode and the electrode.

DESCRIPTION OF THE INVENTION

A photodetector according to the present invention is characterized in that it includes a transparency base substrate, a metal layer provided on one main surface of the base substrate, a photodiode arranged on an upper layer of the metal layer, and an electrode arranged in the vicinity of the photodiode on the upper layer of the metal layer, wherein the photodiode comprises a silicon layer having a semiconductor region, the silicon layer is insulated electrically from the metal layer; the electrode is insulated electrically from the metal layer and the silicon layer; and the metal layer is formed so that a part of the metal layer is overlapped with the silicon layer and the other part of the metal layer is overlapped with the electrode in the thickness direction of the base substrate.

A display device according to the present invention is characterized in that it has an active matrix substrate, wherein the active matrix substrate comprises a transparency base substrate, a plurality of active elements formed on one main surface of the base substrate, and a photodetector, where the photodetector comprises a metal layer provided on one main surface of the base substrate, a photodiode arranged on an upper layer of the metal layer, and an electrode arranged in the vicinity of the photodiode on the upper layer of the metal layer; the photodiode comprises a silicon layer having a semiconductor region, the silicon layer is insulated electrically from the metal layer; the electrode is insulated electrically from the metal layer and the silicon layer; and the metal layer is formed so that a part of the metal layer is overlapped with the silicon layer and the other part of the metal layer is overlapped with the electrode in the thickness direction of the base substrate.

In the photodetector and the display device according to the present invention, it is preferable that the silicon layer includes a p-type semiconductor region, an intrinsic semiconductor region and an n-type semiconductor region, and that the p-type semiconductor region, the intrinsic semiconductor region and the n-type semiconductor region are adjacent to each other in the planar direction of the silicon layer.

Further, in the display device according to the present invention, the electrode can be a part of a wiring connected to any of the plurality of active elements. Specifically, in a case where the active element is a transistor element, the electrode can be a part of a gate wiring connected to a gate electrode of the transistor element or a part of a source wiring.

(Embodiment)

Figure 1:
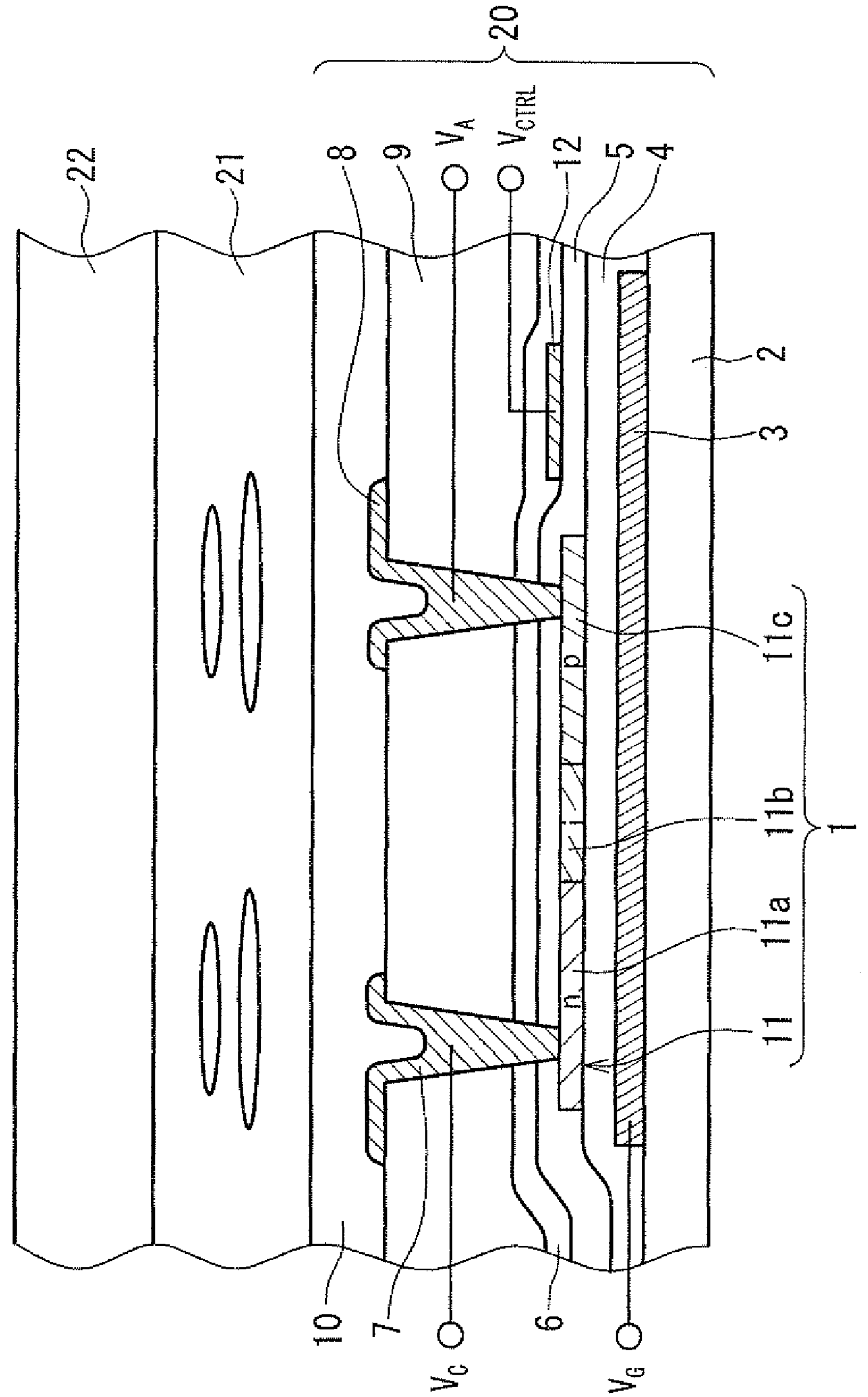
FIG. 1 is a cross-sectional view showing a schematic configuration of a photodetector according to an embodiment of the present invention.
Figure 2:
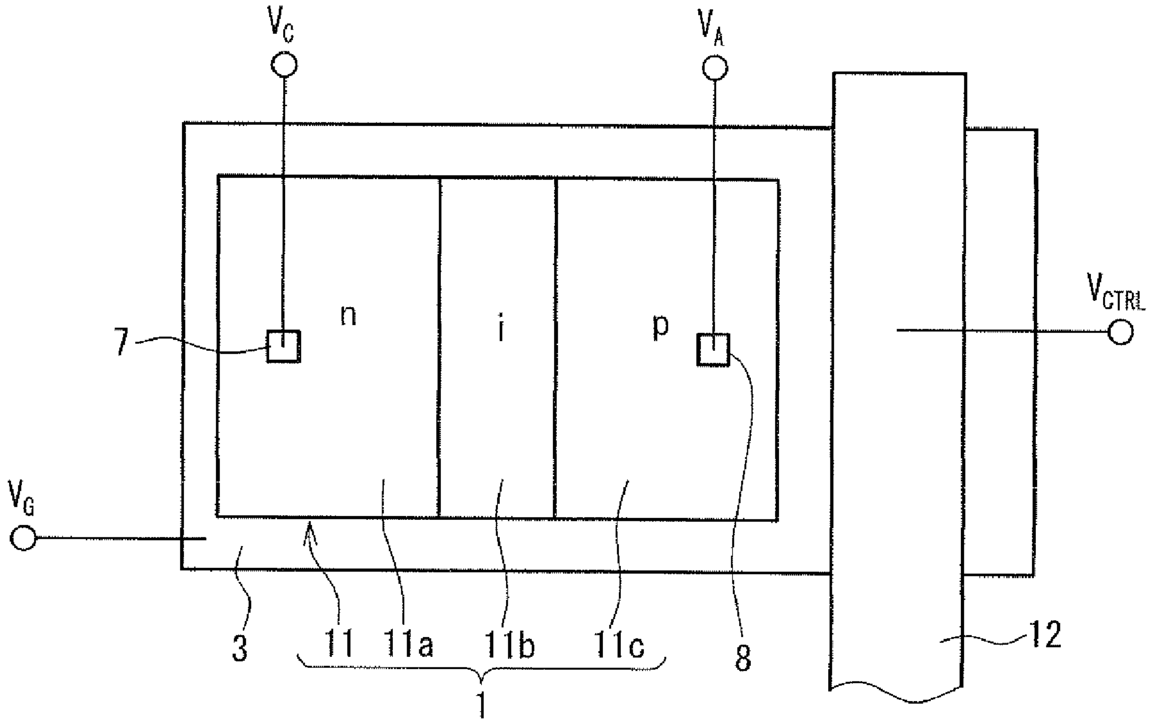
FIG. 2 is a plan view showing from above the photodetector shown in FIG. 1.
Figure 3:
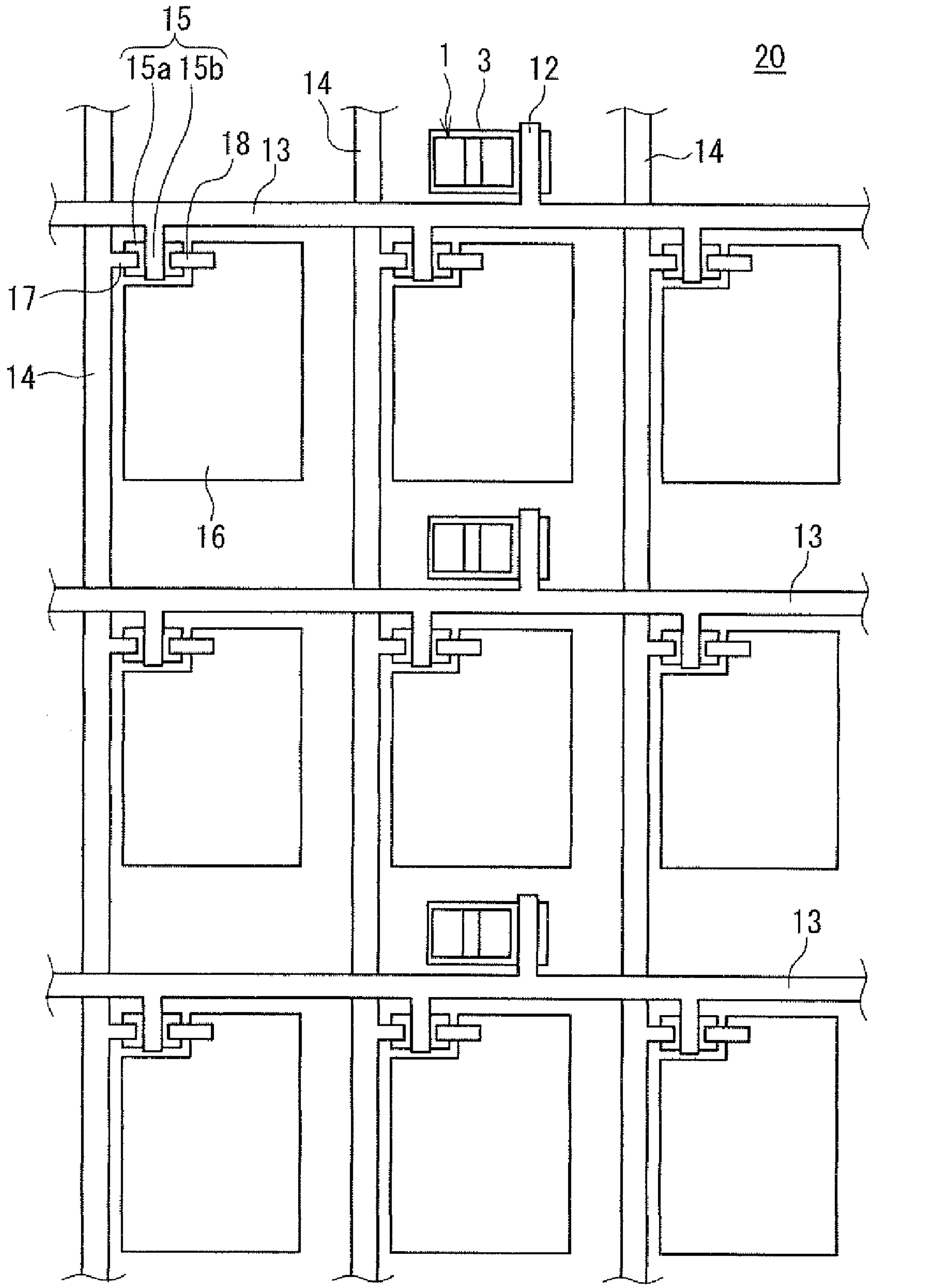
FIG. 3 is a plan view showing a schematic configuration of a part of a display device provided with the photodetector shown in FIG. 1.

Hereinafter, a photodetector and a display device according to an embodiment of the present invention will be described with reference to FIGS. 1-11. First, schematic configurations of a photodetector and a display device according to the present embodiment will be described. FIG. 1 is a cross-sectional view showing a schematic configuration of a photodetector according to the embodiment of the present invention. FIG. 2 is a plan view showing from above the photodetector shown in FIG. 1. FIG. 3 is a plan view showing a schematic configuration of a part of the display device provided with the photodetector shown in FIG. 1. In FIG. 1, only the conductive and semi-conductive members for forming an active matrix substrate 20 as described below are hatched. FIGS. 2 and 3 show the main components only.

As shown in FIG. 1, a photodetector according to the present embodiment is provided to the active matrix substrate 20. The active matrix substrate 20 composes a part of the display device according to the present embodiment. The display device according to the present embodiment is a liquid crystal display device, which is formed by interposing a liquid crystal layer 21 between the active matrix substrate 20 and a filter substrate 22. In FIG. 1, the filter substrate 22 is shown only in the appearance. Though not shown, the filter substrate 22 is provided with a counter electrode and a color filter.

In the present embodiment, as shown in FIG. 3, a plurality of thin film transistors (TFTs) 15 are formed on the active matrix substrate 20. The TFTs 15 are arranged in a matrix together with transparency pixel electrodes 16 on one main surface of the base substrate 2 (see FIG. 1). The TFTs 15 function as active elements for turning on and off the pixel electrodes 16. One TFT 15 and one pixel electrode 16 compose one sub-pixel, and one pixel is composed of a set of three sub-pixels. The three sub-pixels composing one pixel are different from each other in the color of the corresponding color filters.

Furthermore, each of the TFTs 15 is provided with a silicon layer 15*a* on which a source region and a drain region are formed, and a gate electrode 15*b*. The gate electrode 15*b* is formed integrally with a gate wiring 13 arranged along the horizontal direction of a screen. A source electrode 17 is connected to the source region, and a drain electrode 18 is connected to the drain region. The source electrode 17 is formed integrally with a source wiring 14 arranged along the vertical direction of the screen. The drain electrode 18 is connected to the pixel electrode 16.

As shown in FIGS. 1 and 2, the photodetector includes the transparency base substrate 2, a metal layer 3 provided on a main surface of the base substrate 2, a photodiode 1 arranged on an upper layer of the metal layer 3, and an electrode 12 also arranged on the upper layer of the metal layer 3. In the present embodiment, the base substrate 2 composes a part of the active matrix substrate 20. The metal layer 3 is a light-shielding layer provided to prevent incidence of light from a backlight device into the photodiode 1 (hereinafter referred to as "light-shielding layer 3"). The light-shielding layer 3 is insulated electrically in the entire circumference so that it is in an electrically suspended state.

Further as shown in FIGS. 1 and 2, the photodiode 1 includes a silicon layer 11 having a semiconductor region. The silicon layer 11 is formed on an insulating layer 4 that covers the light-shielding layer 3, and insulated electrically from the light-shielding layer 3. In the present embodiment, the photodiode 1 is a PIN diode having a lateral structure. In the silicon layer 11, an n-type semiconductor region (n-layer) 11*a*, an intrinsic semiconductor region (i-layer) 11*b* and a p-type semiconductor region (p-layer) 11*c* are provided in this order. Among these semiconductor regions, the i-layer 11*c* serves as the photodetection region of the photodiode 1. The n-layer 11*a*, the i-layer 11*c* and the p-layer 11*c* are formed adjacent to each other in the planar direction of the silicon layer 11.

The i-layer 11*c* is not limited particularly as long as it is electrically neutral in comparison with the adjacent n-layer 11*a* and the p-layer 11*c*. It is preferable that the i-layer 11*c* is completely free of impurities and/or it is a region where the conduction electron density and the hole density are equal to each other. Alternatively however, the i-layer 11*b* can be an n-region where the diffusion concentration of the n-type impurity is lower than that of the n-layer 11*a*, or a p-region where the diffusion concentration of the p-type impurity is lower than that of the p-layer 11*c*.

In the present embodiment, the type of the silicon composing the silicon layer 11 is not limited particularly. However, from the viewpoint of the charge-transfer rate, the silicon layer 11 is formed preferably of a continuous grain boundary silicon or a low-temperature poly-silicon. It is also preferable that the silicon layer 11 is formed by using the process for forming the TFT 15 (see FIG. 3).

Further, as shown in FIGS. 1 and 2, the electrode 12 is formed in the vicinity of the photodiode 1 so as to be electrically insulated from both the light-shielding layer 3 and the silicon layer 11. In the present embodiment, the electrode 12 is formed on the interlayer insulating layer 5 that covers the silicon layer 11. The electrode 12 is insulated electrically from the silicon layer 11 by the interlayer insulating layer 5, and is insulated electrically from the light-shielding layer 3 by both the insulating layer 4 and the interlayer insulating layer 5. Furthermore, as shown in FIG. 2, the electrode 12 is adjacent to the silicon layer 11 when viewed from above. On the electrode 12, an interlayer insulating layer 6 is formed further to cover the electrode 12.

Furthermore as shown in FIG. 2, the light-shielding layer 3 is formed so that a part thereof is overlapped with the silicon layer 11 and the other part is overlapped with the electrode 12 in the thickness direction of the base substrate 2. Namely, the light-shielding layer 3 is formed to cover not only the region right below the silicon layer 11 but the region right below the electrode 12. In the present embodiment, only the i-layer 11*c* of the silicon layer 11 is the photodetection region. The light-shielding layer 3 is not limited particularly as long as it shields at least the i-layer 11*c* of the silicon layer 11.

Figure 12:
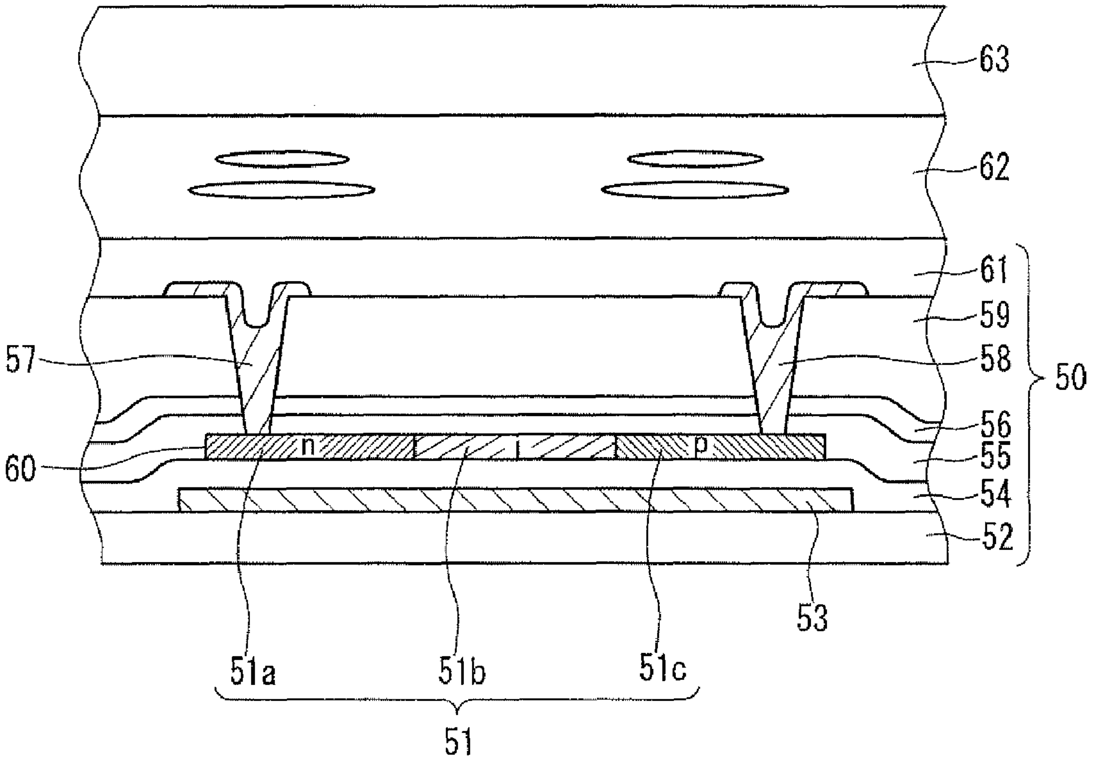
FIG. 12 is a cross-sectional view showing a configuration of a conventional liquid crystal display panel provided with a photodiode.

As mentioned above, unlike the example described in the Technical Field with reference to FIG. 12, the light-shielding layer 3 is formed beyond the region right below the photodiode 1 according to the present embodiment, and the electrode 12 is formed further thereon. Therefore, the electric potential of the light-shielding layer (metal layer) 3 can be adjusted by applying a voltage to the electrode 12, and thus the relationship between the electric potential of the light-shielding layer 3 and the output characteristics of the photodiode 1 can be controlled.

Therefore, as shown in FIG. 3, in a case where a plurality of photodiodes 1 of the same specification are formed on one active matrix substrate 20, voltages of the electrodes 12 corresponding respectively thereto are adjusted. And in a case where the reverse bias voltages are uniform, the output characteristics of the respective photodiodes 1 also will be uniform, and occurrence of variations in the output characteristics among the photodiodes 1 is suppressed. This will be described later in detail.

Furthermore in the present embodiment, as shown in FIG. 3, the electrode 12 composes a part of the gate wiring 13. Application of voltage to the electrode 12 is carried out when a corresponding gate wiring 13 is not selected. And the level of the voltage to be applied to the electrode 12 at this time is set to a value lower than the threshold voltage of the TFT 15 so as to prevent the 15 (see FIG. 3) from being unnecessarily turned on.

In the present embodiment, the electrode 12 is not limited to the above-described example as long as it composes a part of the wiring connected to any of the TFTs (active elements) 15. For instance, it can be a part of the source wiring connected to the TFT 15. In this case, a voltage signal is applied to the electrode 12 at a selected timing that the source wiring is not used for sending a display signal.

In FIG. 1, numeral 9 denotes a flattening layer, and 10 denotes a protective layer. Numeral 7 denotes a wiring connected to the n-layer 11*a*, and 8 denotes a wiring connected to the p-layer 11*c*. The wirings 7 and 8 are formed to penetrate the interlayer insulating layers 5, 6 and the flattening layer 9. The wirings 7 and 8 are not shown in FIG. 3.

Next, setting of a voltage $V_{CTRL}$ to be applied to the electrode 12 (see FIGS. 1-3) will be described with reference to FIGS. 4-11. First, an influence imposed on the photodiode 1 by an electric potential $V_G$ of the light-shielding layer 3 in a state where no voltage is applied to the electrode 12 (a state where there is no electrode 12) is explained with reference to FIGS. 4-6.

Figure 4A:
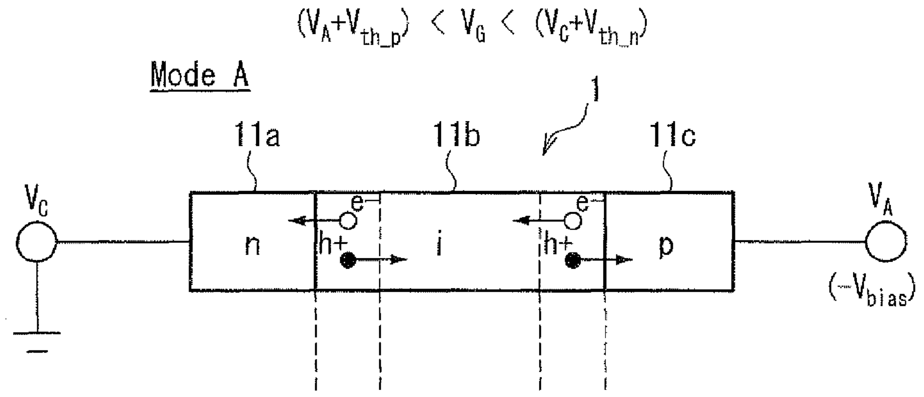
FIG. 4A shows flows of free electrons and positive holes.
Figure 4B:
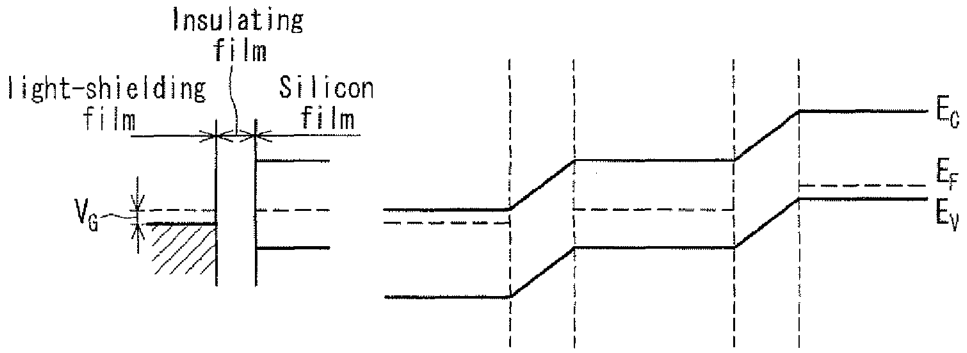
FIG. 4B shows an energy hand in the photodiode.
Figure 4C:
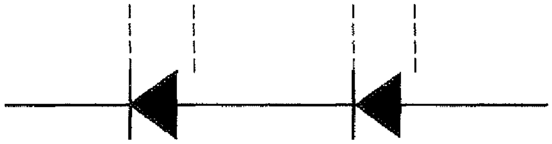
FIG. 4C shows an equivalent circuit.
Figure 5A:
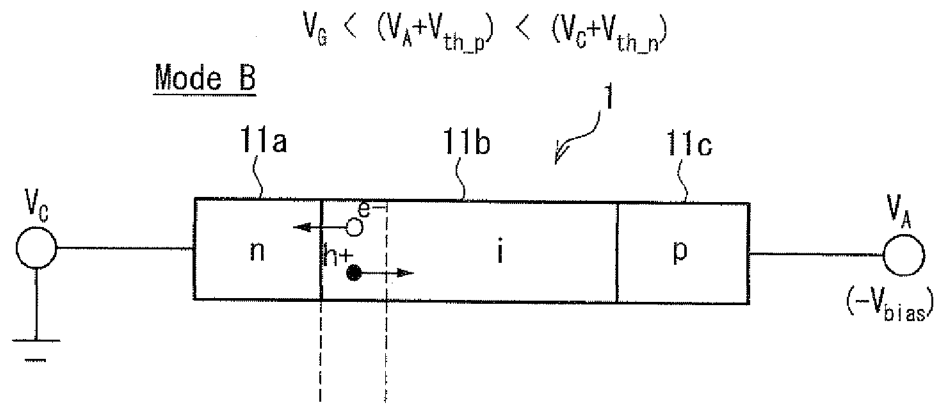
FIG. 5A shows flows of free electrons and positive holes.
Figure 5B:
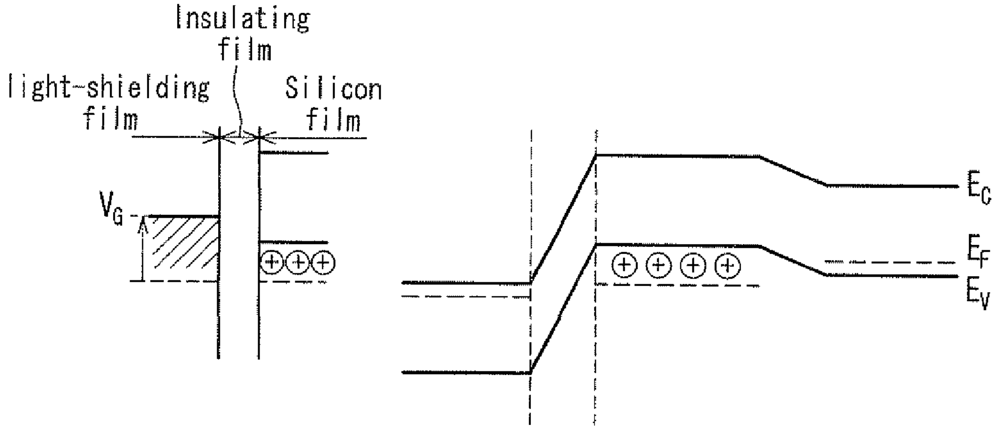
FIG. 5B shows an energy band in the photodiode.
Figure 5C:
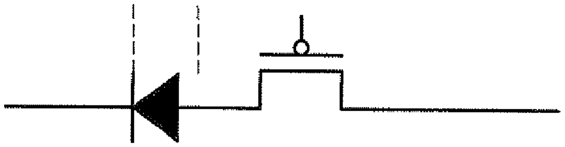
FIG. 5C shows an equivalent circuit.
Figure 6A:
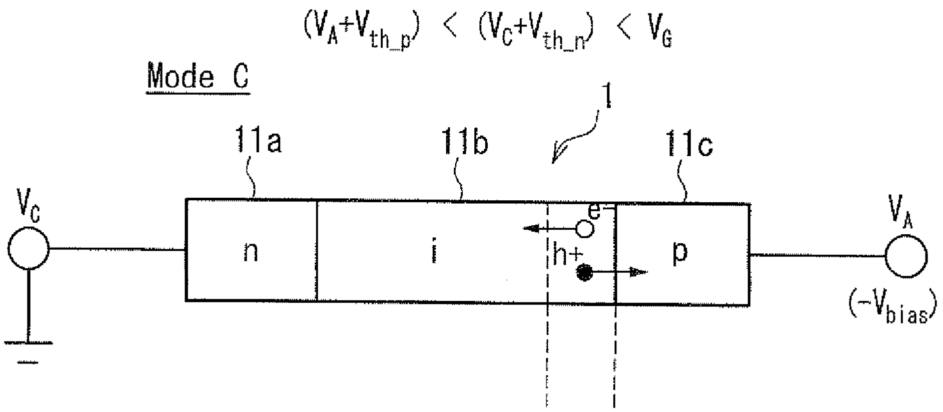
FIG. 6A shows flows of free electrons and positive holes.
Figure 6B:
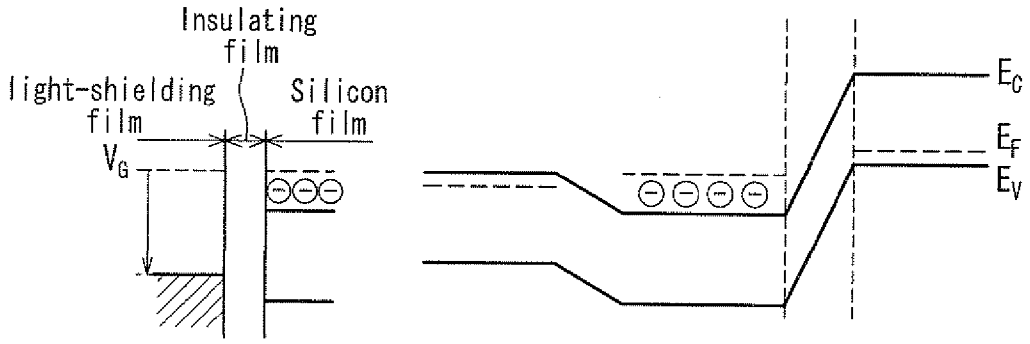
FIG. 6B shows an energy band in the photodiode.
Figure 6C:
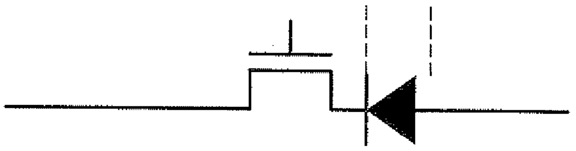
FIG. 6C shows an equivalent circuit.

FIGS. 4-6 are diagrams respectively showing the electric potentials of the light-shielding layers and the states of the photodiodes. FIGS. 4A, 5A and 6A show the flows of free electrons and positive holes, FIGS. 4B, 5B and 6B show energy bands in the photodiodes, and FIGS. 4C, 5C and 6C show equivalent circuits. The electric potential $V_G$ of the light-shielding layer 3 in FIG. 4 satisfies the formula (1) below, the same electric potential in FIG. 5 satisfies the formula (2) below, and the same electric potential in FIG. 6 satisfies the formula (3) below.

In FIGS. 4-6, $V_C$ denotes an electric potential in the n-layer 11*a* of the photodiode 1, and $V_A$ denotes an electric potential in the p-layer 11*c* of the photodiode 1. $V_{th\_n}$ denotes a threshold voltage for a case of a n-channel MOS transistor having the n-layer 11*a* as a source-drain region, the light-shielding layer 3 as a gate electrode, and the insulating layer 4 as a gate insulating layer. Similarly, $V_{thp}$ denotes a threshold voltage for a case of a p-channel MOS transistor having the p-layer 11*c* as a source-drain region, the light-shielding layer 3 as a gate electrode, and the insulating layer 4 as a gate insulating layer. $E_C$ denotes an energy level in a conduction band, $E_F$ denotes an energy level in a forbidden band, and $E_V$ denotes an energy level in a valence band.

[Formula 1]

$$(V_A+V_{th\_p})<V_G<(V_C+V_{th\_n}) \quad (1)$$

[Formula 2]

$$V_G<(V_A+V_{th\_p})<(V_C+V_{th\_n}) \quad (2)$$

[Formula 3]

$$(V_A+V_{th\_p})<(V_C+V_{th\_n})<V_G \quad (3)$$

As shown in FIGS. 4A and 4B, in a case where the electric potential $V_G$ of the light-shielding layer 3 satisfies the above formula (1) (hereinafter, this case is referred to as "mode A"), transfer of the free electrons and the positive holes will occur easily in the vicinity of both the interfaces of the i-layer 11*b*. As shown in FIG. 4C, in the mode A, a current can flow smoothly within the photodiode 1.

As shown in FIGS. 5A and 5B, in a case where the electric potential $V_G$ of the light-shielding layer 3 satisfies the above formula (2) (hereinafter, this case is referred to as "mode B"), transfer of the free electrons and the positive holes will occur easily only in the vicinity of the interface of the i-layer 11*b* at the n-layer 11*a* side. As shown in FIG. 5C, in the mode B, the current flow is hindered by the i-layer 11*b*.

As shown in FIGS. 6A and 6B, in a case where the electric potential $V_G$ of the light-shielding layer 3 satisfies the above formula (3) (hereinafter, this case is referred to as "mode C"), transfer of the free electrons and the positive holes will occur easily only in the vicinity of the interface of the i-layer 11*b* at the p-layer lie side. As shown in FIG. 6C, in the mode C, the current flow is hindered by the i-layer 11*b* similarly to the case of the mode B.

Figure 7:
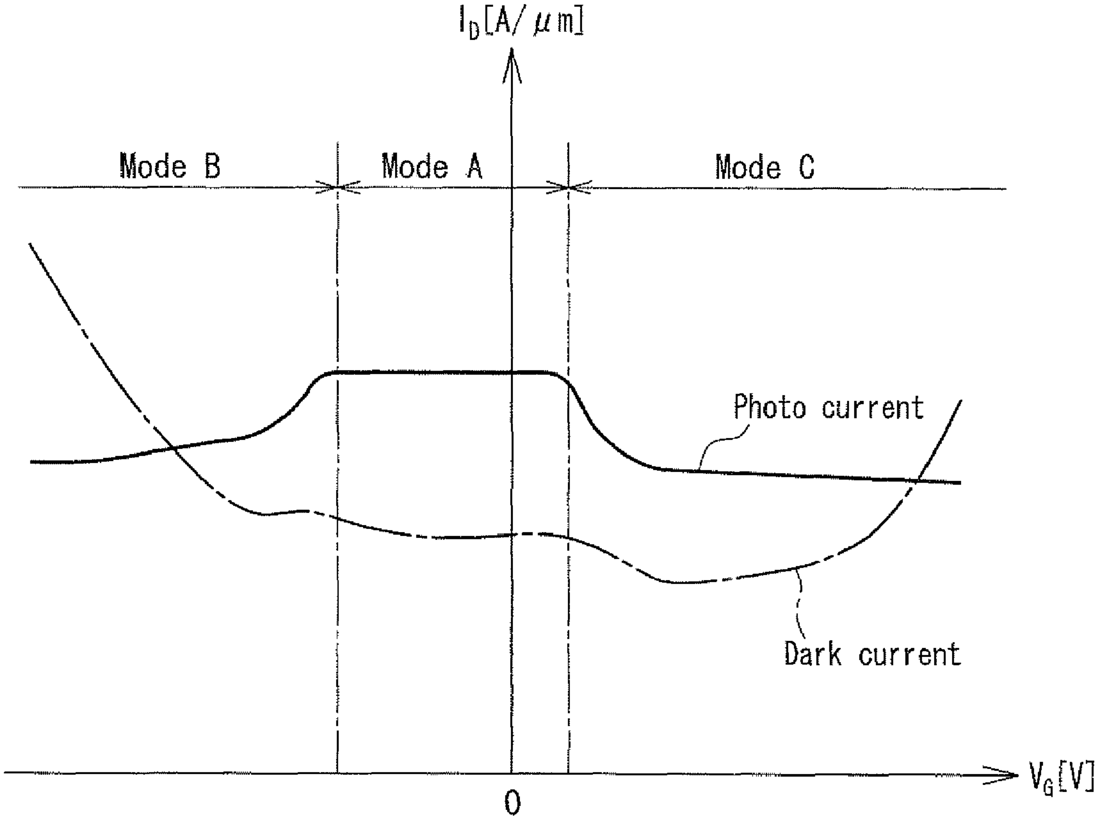
FIG. 7 is a diagram showing a relationship between a photocurrent in the photodiode and an electric potential of the light-shielding layer.

Here, the relationship between the respective modes and a photocurrent will be explained with reference to FIG. 7. FIG. 7 is a diagram showing the relationship between a photocurrent in the photodiode and the electric potential of the light-shielding layer. In FIG. 7, the y-axis indicates a current value [A/μm] of a current outputted from the photodiode 1, and the x-axis indicates the electric potential $V_G$ [V] of the light-shielding layer 3.

As shown in FIG. 7, the photocurrent and the dark current of the photodiode 1 fluctuate depending on the electric potential $V_G$ of the light-shielding layer 3. And there is a tendency that the photocurrent increases the most and the dark current becomes the lowest at the time of the mode A as shown in FIG. 4. Namely, when the photodiode 1 is in the mode A, the ratio of the photocurrent to the dark current (S/N ratio) is raised, and the output characteristics of the photodiode 1 turns to be a preferable state. That is, as shown in FIGS. 4-7, the output characteristics of the photodiode 1 fluctuate together with the fluctuation in the electric potential of the light-shielding layer 3. And the photocurrent and the dark current fluctuate remarkably when there occurs a switchover between the modes. In light of this, it is preferable that a switchover from one mode to another does not occur.

It should be noted that FIG. 7 shows only one example, and actually the mode A range varies among the photodiodes. Namely, the relationship between the electric potential $V_G$ of the light-shielding layer 3 and the output characteristics of the photodiode 1 varies among the photodiodes 1. This is because that the diffusion concentrations of the n-layer 11*a* and the p-layer 11*c* vary even among the photodiodes of the same specification, and thus variations exist in the threshold voltages $V_{th\_n}$ and $V_{th\_p}$. Another reason is that the electric charge amount of the fixed charge contained in the photodiode 1, the light-shielding layer 3 and the like varies among the photodiodes. Hereinafter, the variations in the range of the mode A will be described with reference to FIGS. 8-10.

Figure 8:
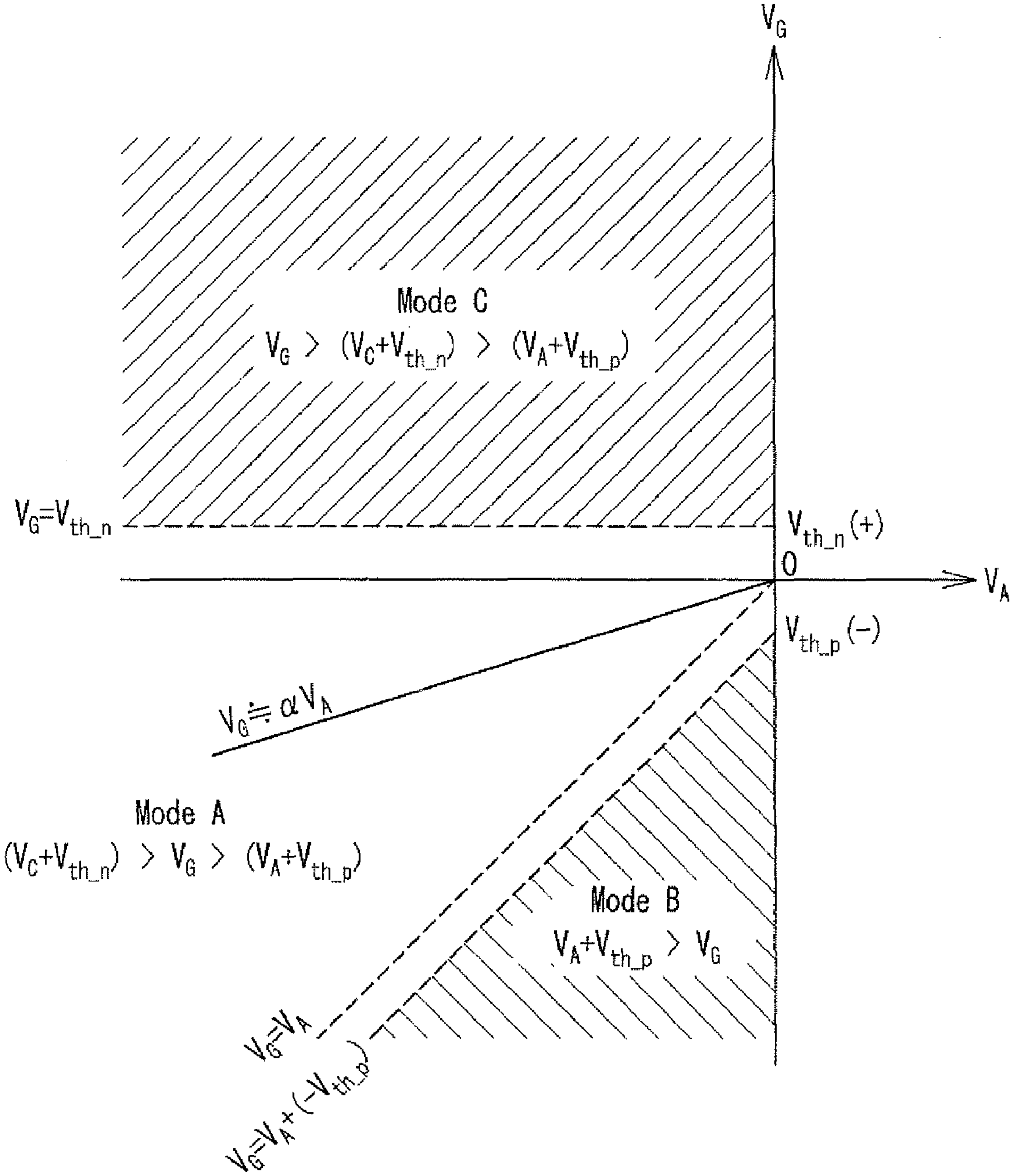
FIG. 8 is a diagram showing the respective ranges of a mode A to a mode C.
Figure 9:
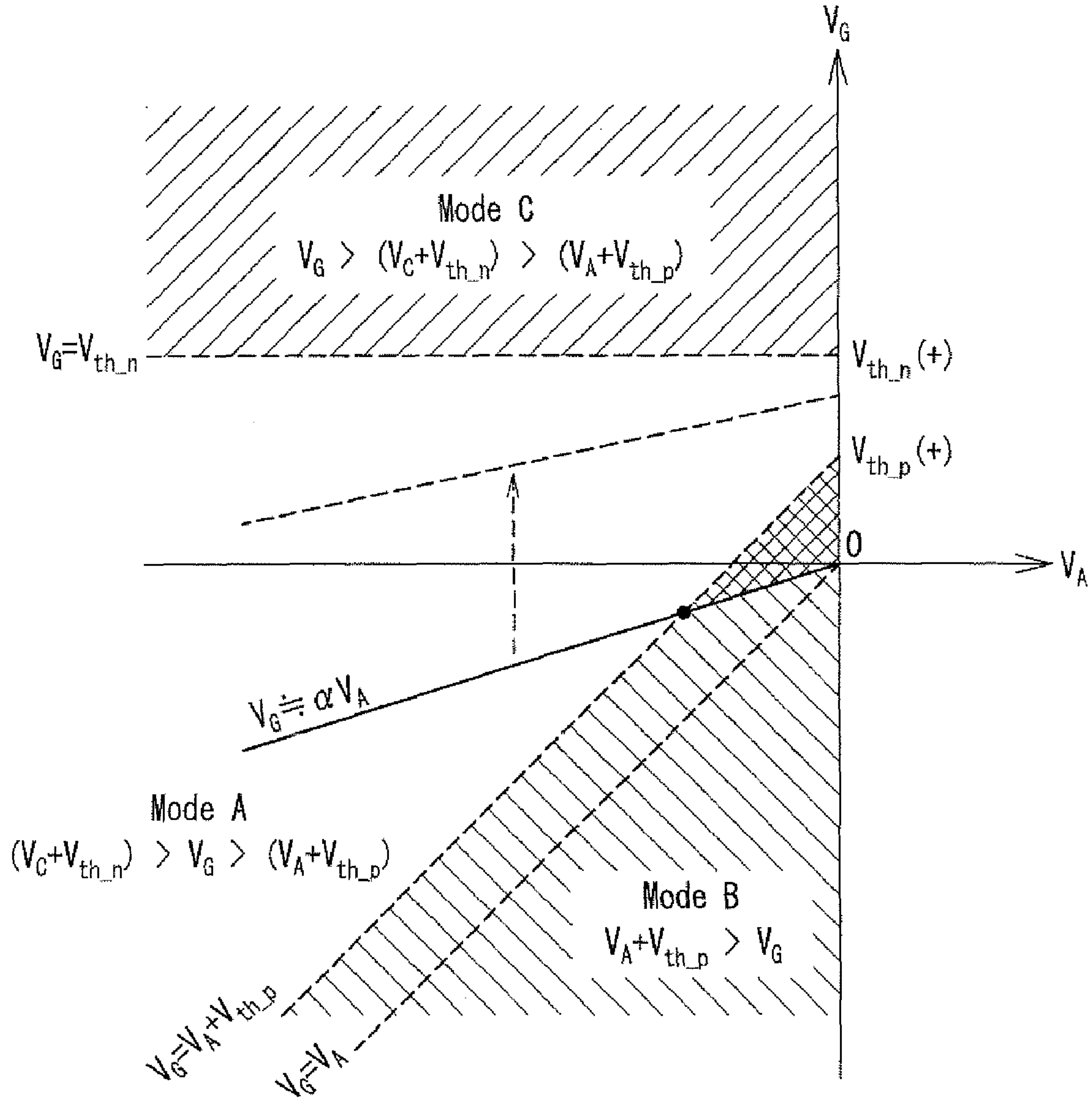
FIG. 9 is a diagram showing the respective ranges of a mode A to a mode C.
Figure 10:
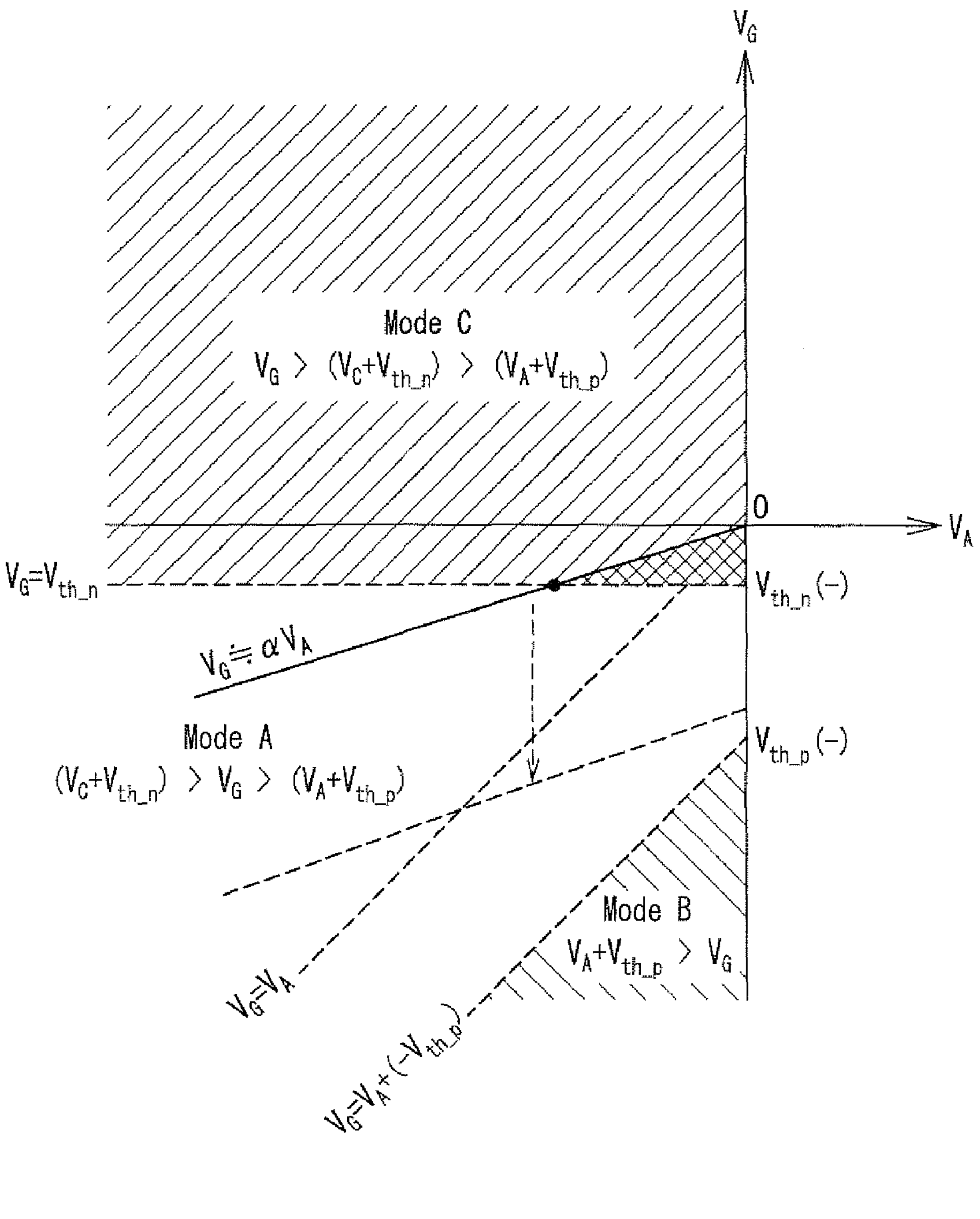
FIG. 10 is a diagram showing the respective ranges of a mode A to a mode C.

FIGS. 8-10 are diagrams showing the respective ranges of the mode A to the mode C, which are different from each other in the relationship between the electric potentials of the light-shielding layers and the output characteristics of the photodiodes. In each of the drawings, the y-axis indicates the electric potential $V_G$ of the light-shielding layer, and the x-axis indicates the electric potential $V_A$ of the p-layer 11*c*.

Here, the electric potential $V_G$ of the light-shielding layer 3 will be discussed. First, between the light-shielding layer 3 and the photodiode 1, capacitances are formed by the insulating layer 4. When the capacitance between the n-layer 11*a* and the light-shielding layer 3 is expressed as $C_{gc}$ and the capacitance between the p-layer 11*c* and the light-shielding layer 3 is expressed as $C_{ga}$ (see FIG. 11), the electric potential $V_G$ of the light-shielding layer 3 can be approximated as shown in the formula (4) below by using the electric potential $V_A$ of the p-layer 11*c*.

[Formula 4]

$$V_G \fallingdotseq V_A\left(\frac{C_{ga}}{C_{gc}+C_{ga}}\right) \quad (4)$$

In the above formula (4), when $(C_{ga}/C_{gc}+C_{ga})=\alpha$, the electric potential $V_G$ of the light-shielding layer 3 can be approximated further by using the formula (5) below. In FIGS. 8-10, the electric potential $V_G$ of the light-shielding layer 3 is expressed by the formula (5) below.

[Formula 5]

$$V_G \approx \alpha V_A \quad (5)$$

For instance, when the length $L_p$, of the p-layer lie in the forward direction and the length $L_n$ of the n-layer 11*a* in the forward direction are equal to each other, the α value becomes (½). In fact however, in the above formula (5), the a value is not constant but it varies among the modes. Therefore in the example as shown in FIGS. 9 and 10, the gradient of the straight line indicating the above formula (5) will vary among the modes.

For example, in the mode B, the region of the p-layer 11*c* is increased substantially as shown in FIG. 5, and the $C_{ga}$ value becomes greater in comparison with the case of the mode A. Therefore in the mode B, the α value become greater and the gradient of the straight line indicating the above formula (5) becomes larger. On the other hand, in the mode C, the region of the n-layer 11*a* is increased substantially as shown in FIG. 6, and the $C_{gc}$ value becomes greater in comparison with the case of the mode A. Therefore in the mode C, the a value become smaller and the gradient of the straight line indicating the above formula (5) becomes smaller. However, since the fluctuation width of the actual α value is trivial, it is not shown in FIGS. 8-10.

Hereinafter, FIGS. 8-10 will be reviewed. In an example as shown in FIG. 8 where the threshold voltage $V_{th\_n}$ is positive and the threshold voltage $V_{th\_p}$ is negative, a straight line indicating the above formula (5) exists constantly within the range of the mode A irrespective of the electric potential $V_A$ of the p-layer 11*c*. Therefore in this case, the photodiode 1 is in the state of mode A constantly.

In contrast, in an example as shown in FIG. 9 where both the threshold voltages $V_{th\_n}$ and $V_{th\_p}$ are positive, the straight line indicating the above formula (5) crosses the boundary line between the mode A and the mode B when the electric potential $V_A$ of the p-layer 11*c* approaches zero. At this time, the mode of the photodiode 1 is changed from the mode A to the mode B, and the output characteristics fluctuate considerably.

Further in an example as shown in FIG. 10 where both the threshold voltages $V_{th\_n}$ and $V_{th\_p}$ are negative, the straight line indicating the above formula (5) crosses the boundary line between the mode A and the mode C when the electric potential $V_A$ of the p-layer 11*c* approaches zero. At this time, the mode of the photodiode 1 is changed from the mode A to the mode C, and the output characteristics fluctuate considerably.

As shown in FIGS. 8-10, even when the voltages $V_A$ applied to the p-layers 11*c* of the respective photodetectors 1 are equivalent, the modes of the respective photodiodes 1 may vary and thus the respective output characteristics may vary Next, adjustment of the electric potential $V_G$ of the light-shielding layer 3 will be explained with reference to FIG. 11. FIG. 11 is an explanatory view showing the relationship between the light-shielding layer, the photodiode, and the electrode. As shown in FIG. 11, according to the present embodiment, the electrode 12 is arranged in the vicinity of the photodiode. Therefore, when the voltage $V_{CTRL}$ is applied to the electrode 12, an electric field is provided by the electrode 12 to the light-shielding layer 3, and thus the electric potential $V_G$ of the light-shielding layer 3 fluctuates. In this case, the electric potential $V_G$ of the light-shielding layer 3 can be expressed by the formula (6) below.

[Formula 6]

$$V_G \fallingdotseq V_{g0} + V_A\left(\frac{C_{ga}}{C_{CTRL}+C_{diode}}\right) \quad (6)$$

In the above formula (6), the capacitance $C_{CTRL}$ denotes a capacitance formed between the electrode 12 and the light-shielding layer 3. The capacitance $C_{diode}$ is a capacitance between the entire photodiode 1 and the light-shielding layer 3, which is the total of the capacitance $C_{gc}$, a capacitance $C_{gi}$ and the capacitance $C_{ga}(C_{diode}=C_{gc}+C_{gi}+C_{ga})$. The capacitance $C_{gi}$ denotes a capacitance formed between the i-layer 11*b* and the light-shielding layer 3 (see FIG. 11).

Further in the above formula (6), $V_{g0}$ denotes an electric potential that rises due to application of a voltage to the electrode 12. $V_{g0}$ can be expressed by the formula (7) below. By substituting the formula (7) into the above formula (6), the electric potential $V_G$ of the light-shielding layer can be expressed by the formula (8) below.

[Formula 7]

$$V_{g0} \fallingdotseq V_{CTRL}\left(\frac{C_{CTRL}}{C_{CTRL}+C_{diode}}\right) \quad (7)$$

[Formula 8]

$$V_G \fallingdotseq V_{CTRL}\left(\frac{C_{CTRL}}{C_{CTRL}+C_{diode}}\right) + V_A\left(\frac{C_{ga}}{C_{CTRL}+C_{diode}}\right) \quad (8)$$

In this manner, according to the present embodiment, it is possible to adjust the electric potential $V_G$ of the light-shielding layer 3 by adjusting the voltage $V_{CTRL}$ applied to the electrode 12. Therefore for instance, in the example as shown in FIGS. 9 and 10, by adjusting the voltage $V_{CTRL}$, $V_{g0}$ becomes an intercept of a straight line as indicated with the arrows of broken lines in these drawings, and thus the straight line can be translated. In this case, even when the electric potential $V_A$ of the p-layer 11*c* approaches zero, the photodiode 1 is still in the mode A.

In the photodetector and the display device according to the present embodiment, by controlling the electric potential $V_G$ of the light-shielding layer 3 corresponding to the respective photodiodes 1, it is possible to suppress fluctuation in the output characteristics among the photodiodes 1. Namely, it is possible to avoid a situation that a part of the plural photodiodes of the same specification is in the mode Awhile the remaining part is in the mode B or the mode C during a reverse bias voltage of an equal electric potential is applied to the photodiodes 1.

Although the present embodiment refers to a case where the display device is the liquid crystal display device, the display device according to the present embodiment will not be limited to the example. The display device can be an organic EL display device or an inorganic EL display device for instance other than the liquid crystal display device.

INDUSTRIAL APPLICABILITY

As mentioned above, the photodetector of the present invention can be incorporated in a display device such as a liquid crystal display device or an EL display device. A display device of the present invention further can be used as a liquid crystal display device, an EL display device or the like. The photodetector and the display device of the present invention have industrial availability.

The invention claimed is:

1. A photodetector comprising: a transparency base substrate, a metal layer provided on one main surface of the base substrate, a photodiode arranged on an upper layer of the metal layer, and an electrode arranged in the vicinity of the photodiode on the upper layer of the metal layer, wherein the photodiode comprises a silicon layer having a semiconductor region, the silicon layer is insulated electrically from the metal layer;

the electrode is insulated electrically from the metal layer and the silicon layer; and the metal layer is formed so that a part of the metal layer is overlapped with the silicon layer and the other part of the metal layer is overlapped with the electrode in the thickness direction of the base substrate.

2. The photodetector according to claim 1, wherein the silicon layer comprises a p-type semiconductor region, an intrinsic semiconductor region and an n-type semiconductor region; and the p-type semiconductor region, the intrinsic semiconductor region and the n-type semiconductor region are adjacent to each other in the planar direction of the silicon layer.

3. A display device having an active matrix substrate, wherein the active matrix substrate comprises a transparency base substrate, a plurality of active elements formed on one main surface of the base substrate, and a photodetector, the photodetector comprises a metal layer provided on one main surface of the base substrate, a photodiode arranged on an upper layer of the metal layer, and an electrode arranged in the vicinity of the photodiode on the upper layer of the metal layer;

the photodiode comprises a silicon layer having a semiconductor region, the silicon layer is insulated electrically from the metal layer;

the electrode is insulated electrically from the metal layer and the silicon layer; and the metal layer is formed so that a part of the metal layer is overlapped with the silicon layer and the other part of the metal layer is overlapped with the electrode in the thickness direction of the base substrate.

4. The display device according to claim 3, wherein the silicon layer comprises a p-type semiconductor region, an intrinsic semiconductor region and an n-type semiconductor region; and the p-type semiconductor region, the intrinsic semiconductor region and the n-type semiconductor region are formed to be adjacent to each other in the planar direction of the silicon layer.

5. The display device according to claim 3, wherein the electrode is a part of a wiring connected to any of the plurality of active elements.

* * * * *